United States Patent
Lee et al.

(10) Patent No.: US 7,542,356 B2
(45) Date of Patent: Jun. 2, 2009

(54) SEMICONDUCTOR MEMORY DEVICE AND METHOD FOR REDUCING CELL ACTIVATION DURING WRITE OPERATIONS

(75) Inventors: Kwang-Jin Lee, Hwaseong-si (KR); Sang-Beom Kang, Hwaseong-si (KR); Hyung-Rok Oh, Hwaseong-si (KR); Beak-Hyung Cho, Hwaseong-si (KR); Woo-Yeong Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 99 days.

(21) Appl. No.: 11/790,146

(22) Filed: Apr. 24, 2007

(65) Prior Publication Data

US 2008/0101131 A1 May 1, 2008

(30) Foreign Application Priority Data

Nov. 1, 2006 (KR) .................. 10-2006-0107096

(51) Int. Cl.
*G11C 7/06* (2006.01)
(52) U.S. Cl. ............................. 365/189.07; 365/185.14; 365/189.16
(58) Field of Classification Search ............ 365/189.07, 365/185.14, 189.16
See application file for complete search history.

(56) References Cited

U.S. PATENT DOCUMENTS

2005/0092746 A1* 5/2005 Song et al. .................. 219/757

* cited by examiner

*Primary Examiner*—Huan Hoang
*Assistant Examiner*—Anthan T Tran
(74) *Attorney, Agent, or Firm*—Volentine & Whitt, PLLC

(57) ABSTRACT

Embodiments of the invention provide devices or methods that include a status bit representing an inversion of stored data. New data is written to selected cells, the new data is selectively inverted, and the status bit is selectively toggled, based on a comparison between pre-existing data and new data associated with a write command. A benefit of embodiments of the invention is that fewer memory cells must be activated in many instances (when compared to conventional art approaches). Moreover, embodiments of the invention may also reduce the average amount of activation current required to write to variable resistive memory devices and other memory device types.

18 Claims, 11 Drawing Sheets

FIG.4

| Write Number | Cell Data | Status Bit | Write Data | Comp bit | Comp bit Enable | Write case | Activated Cells |
|---|---|---|---|---|---|---|---|
| 1 | '0000 0000' | 0 | '1111 1111' | 1 | 1 | 2 | - 1 ea (status bit) |
| 2 | '0000 0000' | 1 | '1111 1111' | 0 | 0 | 1 | - 0 ea |
| 3 | '0000 0000' | 1 | '1111 1000' | 1 | 0 | 3 | - 3 ea |
| 4 | '0000 0111' | 1 | '0000 0111' | 0 | 1 | 2 | - 1 ea |
| 5 | '0000 0111' | 0 | '1111 0110' | 1 | 1 | 4 | - 4 ea |
| 6 | '0000 1001' | 1 | '1110 0111' | 0 | 0 | 3 | - 1 ea |
| 7 | '0000 1000' | 1 | '0000 0000' | 1 | 1 | 4 | - 2 ea |
| 8 | '0000 0000' | 0 | | | | | |

410
420
430
440

| Write Case | Description |
|---|---|
| 1 | All bit Match case |
| 2 | No bit Match case |
| 3 | Match bit>=(N/2) |
| 4 | Match bit<(N/2) |

FIG.5

- Initial Stored Cell Data : '0000 0000 0000 0000' Case (partial transition : < N/2)

| Types | Input Write Data | Update Cell Write | Status Bit | Activated Cells |
|---|---|---|---|---|
| Conventional Art1 | '0000 0000 0011 1111' | '0000 0000 0011 1111' | - N/A | - 16 ea |
| Conventional Art2 | '0000 0000 0011 1111' | '0000 0000 0011 1111' | - N/A | - 6 ea |
| Proposed Art | '0000 0000 0011 1111' | '0000 0000 0011 1111' | '0' | - 6 ea |

510 ⟶ 512

- Initial Stored Cell Data : '0000 0000 0000 0000' Case (partial transition : > N/2)

| Types | Input Write Data | Update Cell Write | Status Bit | Activated Cells |
|---|---|---|---|---|
| Conventional Art1 | '0000 0011 1111 1111' | '0000 0011 1111 1111' | - N/A | - 16 ea |
| Conventional Art2 | '0000 0011 1111 1111' | '0000 0011 1111 1111' | - N/A | - 10 ea |
| Proposed Art | '0000 0011 1111 1111' | '1111 1100 0000 0000' | '1' | - 7 ea |

520 ⟶ 522

- Initial Stored Cell Data : '0000 0000 0000 0000' Case (all transition : N)

| Types | Input Write Data | Update Cell Write | Status Bit | Activated Cells |
|---|---|---|---|---|
| Conventional Art1 | '1111 1111 1111 1111' | '1111 1111 1111 1111' | - N/A | - 16 ea |
| Conventional Art2 | '1111 1111 1111 1111' | '1111 1111 1111 1111' | - N/A | - 16 ea |
| Proposed Art | '1111 1111 1111 1111' | '0000 0000 0000 0000' | '1' | - 1 ea (status bit) |

530 ⟶ 532

Inversion Decision Unit (22)

SEMICONDUCTOR MEMORY DEVICE AND METHOD FOR REDUCING CELL ACTIVATION DURING WRITE OPERATIONS

BACKGROUND AND SUMMARY

1. Field of the Invention

The present invention relates generally to semiconductor memory devices, and more particularly to a device and method for reducing cell activation during write operations.

This application claims priority under 35 U.S.C. §119 from Korean Patent Application 10-2006-0107096, filed on Nov. 1, 2006, the contents of which are hereby incorporated by reference in their entirety for all purposes as if fully set forth herein.

2. Description of the Related Art

There are many types of memory devices. Nonvolatile memory types include variable resistive memory devices such as PRAM (Phase change Random Access Memory) containing phase change material, RRAM (Resistive Random Access Memory) containing material having properties of variable resistance, and an MRAM (Magnetic Random Access Memory) containing ferromagnetic material. Materials forming such memory devices have in common a characteristic that a resistance value is varied by current or voltage. In the variable resistive semiconductor memory device, a unit memory cell is constructed of one variable resistance and one switching device. The variable resistance is connected between a bit line and the switching device, and the switching device is generally connected with the variable resistance and a word line. Read and write operations in a variable resistive semiconductor memory device are disclosed in U.S. Pat. Nos. 6,487,113, 6,570,784, and 6,667,900.

One problem with variable resistive semiconductor memory devices and some other memory device types is that activation current demands increase with the number of cells that are activated during a write operation. The problem and a known solution are illustrated in FIGS. 1 and 2, respectively.

FIG. 1 is a flowchart of a write operation according to one example of a conventional art (hereinafter conventional art 1). In write operation S10, all cells of a memory device must be activated in response to a write command. For example, if a write command is associated with a 16 bit data word, then all 16 corresponding cells are activated in a memory device during write operation S10.

FIG. 2 is a flowchart of write operation according to another example of the conventional art (hereinafter conventional art 2). The process illustrated in FIG. 2 seeks to reduce the number of memory cells that must be activated for a write operation. In pre-read step S20, the process reads the current logic state of each target memory cell. Next, in step S21, the process compares each bit of pre-read data from step S20 with each corresponding bit of write data. If all bits match, then the write operation concludes without activating any memory cells. Otherwise, the process advances to steps S22 and S23 where data associated with unmatched bits are selected and written to corresponding memory cells. The process illustrated in FIG. 2 thus reduces the number of cells that must be activated during a write. The reduction is the greatest where all cells match, and can still be substantial where the number of unmatched data bits is relatively small.

The process in FIG. 2 has many disadvantages, however. For example, where all pre-read data bits and write data bits are mismatched, there is no reduction in the number of memory cells that must be activated. Moreover, where there are a large number of mismatched bits, the advantages of conventional art 2 are relatively modest. Devices and methods that further reduce the number of memory cells that must be activated during a write operation are needed.

SUMMARY OF THE INVENTION

Embodiments of the invention provide devices or methods that include a status bit representing an inversion of stored data. New data is written to selected memory cells, the new data is selectively inverted, and the status bit is selectively toggled, all based on a comparison between pre-existing data and new data associated with a write command. A benefit of embodiments of the invention is that fewer memory cells must be activated in many instances (when compared to conventional art approaches). Moreover, embodiments of the invention may also reduce the average amount of activation current required to write to variable resistive memory devices and other memory device types.

An embodiment of the invention provides a method for writing data to a memory device A method for writing data to a memory device comprising; receiving N-bit write data, reading N-bit cell data in the memory device, reading a status bit in the memory device, the status bit being associated with the N-bit cell data, and if the status bit is high, inverting each bit of the N-bit cell data to produce inverted N-bit cell data.

An embodiment of the invention provides a write circuit that includes a verify sense amplifier configured to read N-bit read data in a memory device and further configured to read a status bit in the memory device, and a data comparison unit coupled to the verify sense amplifier, the data comparison unit configured to optionally invert the N-bit read data based on the status bit.

BRIEF DESCRIPTION OF THE DRAWINGS

The present invention will become more fully understood from the detailed description given herein and the accompanying drawings which are given by way of illustration only, and thus are not limitative of the present invention, and wherein:

FIG. 4 is a table illustrating the number of memory cells activated in a write operation according to an embodiment of the invention;

FIG. 5 includes three tables, each comparing embodiments of the invention with the-conventional art;

DETAILED DESCRIPTION

Embodiments of the present invention now will be described more fully hereinafter with reference to FIGS. 3A to 8, in which embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Figure 1:
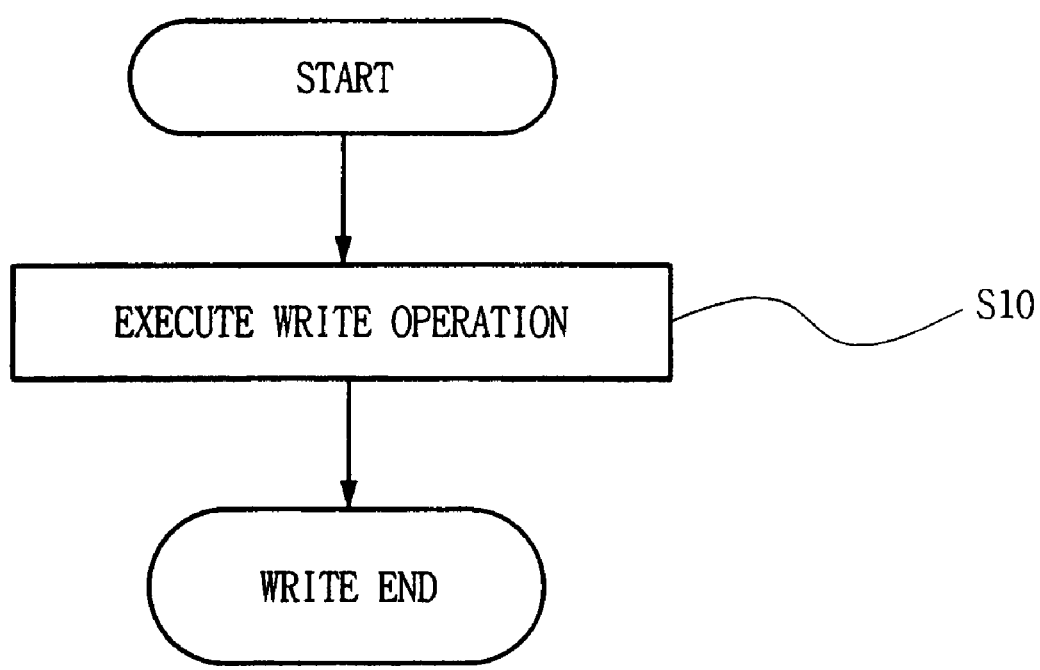
FIG. 1 is a flowchart for a write operation according to conventional art 1.
Figure 2:
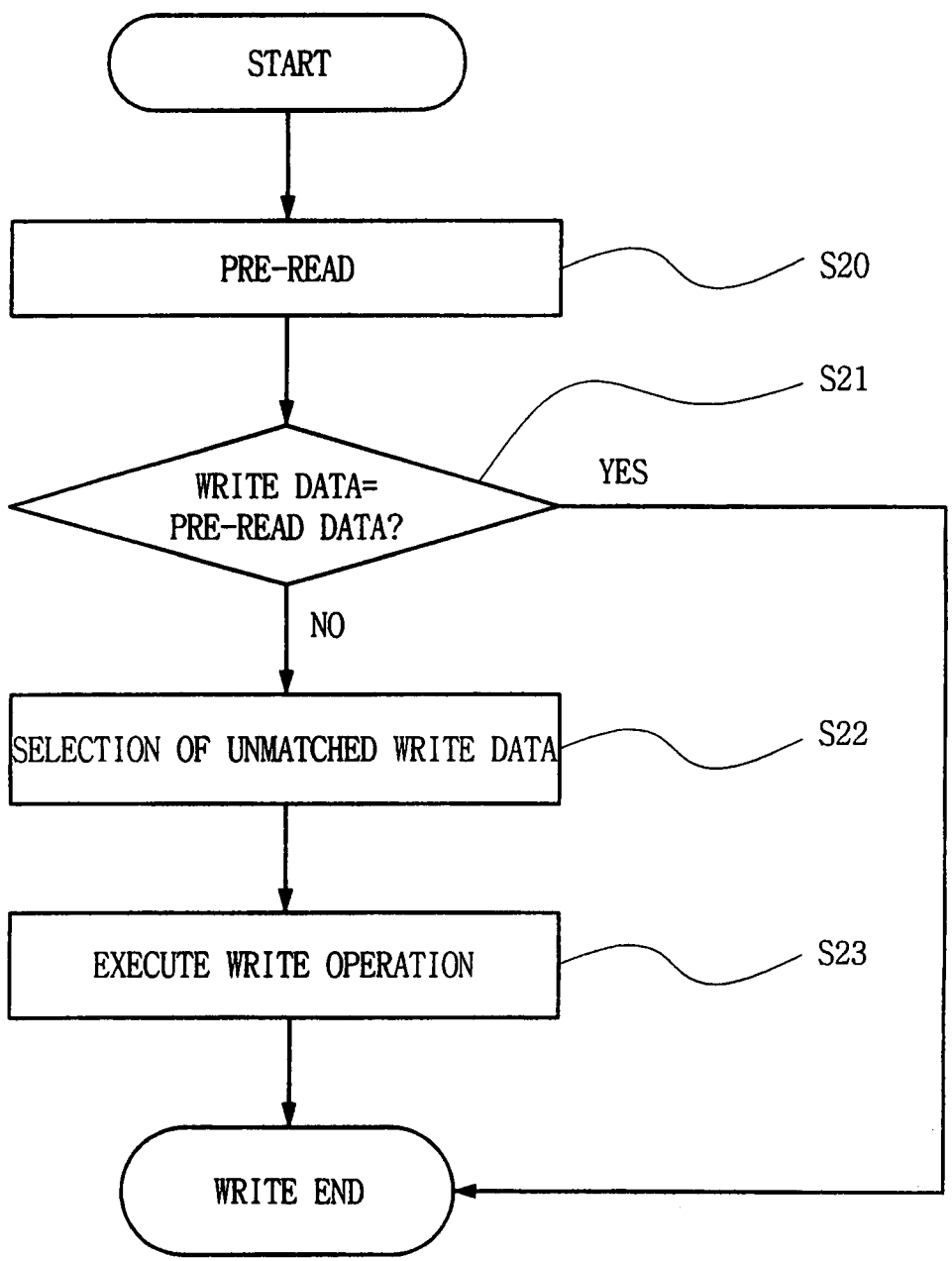
FIG. 2 is a flowchart for a write operation according to conventional art 2.
Figure 3A:
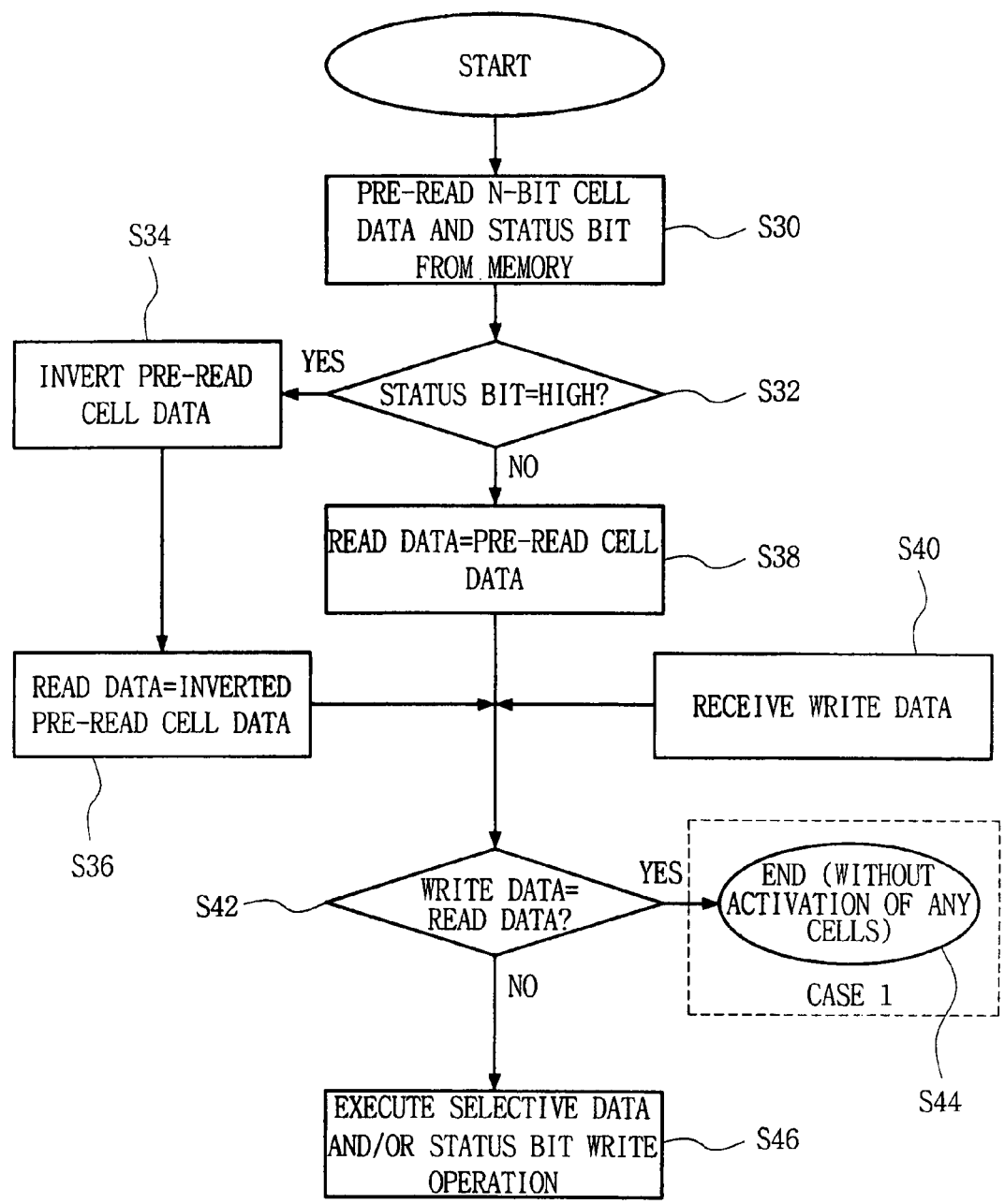
FIG. 3A is a flowchart for a write operation according to an embodiment of the invention.

FIG. 3A is a flowchart for a write operation according to an embodiment of the invention. The process begins by pre-reading N-bit cell data and a status bit from memory in step S30. In conditional step S32, the process determines whether the status bit is high. A high status bit indicates that the stored data bits are inverted. Where the status bit is determined to be high, the process advances to step S34 to invert the pre-read cell data, and then to step S36 where the read data is set equal to the inverted pre-read cell data. Otherwise, the process advances to step S38 where the read data is set equal to pre-read cell data. Accordingly, the effect of steps S32, S34, S36, and S38 is to invert the pre-read cell data (bit by bit) if and only if the status bit is set high during pre-read.

Figure 3B:
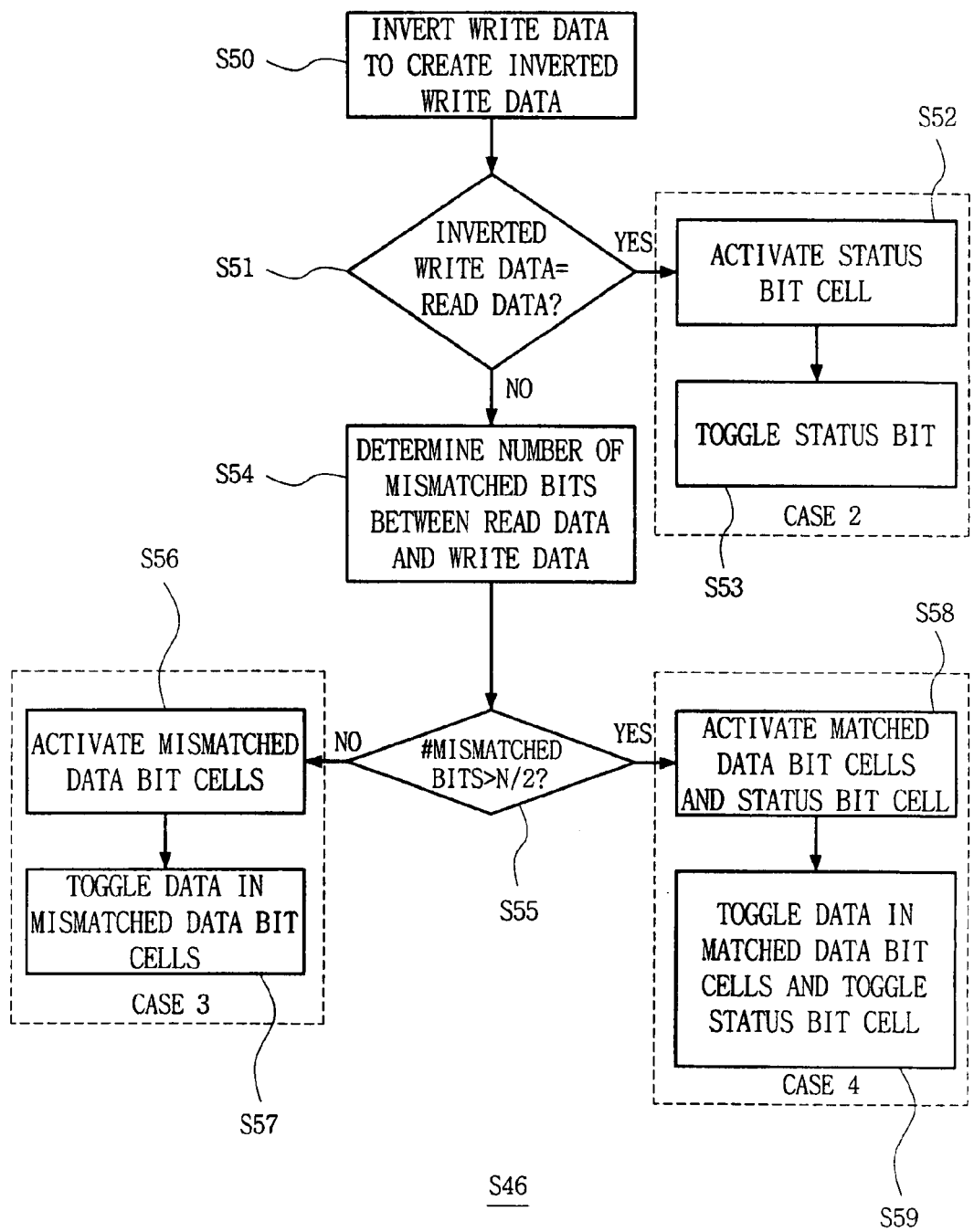
FIG. 3B is a flowchart for the selective data and/or status bit write operations shown in FIG. 3A, according to an embodiment of the invention.
Figure 3C:
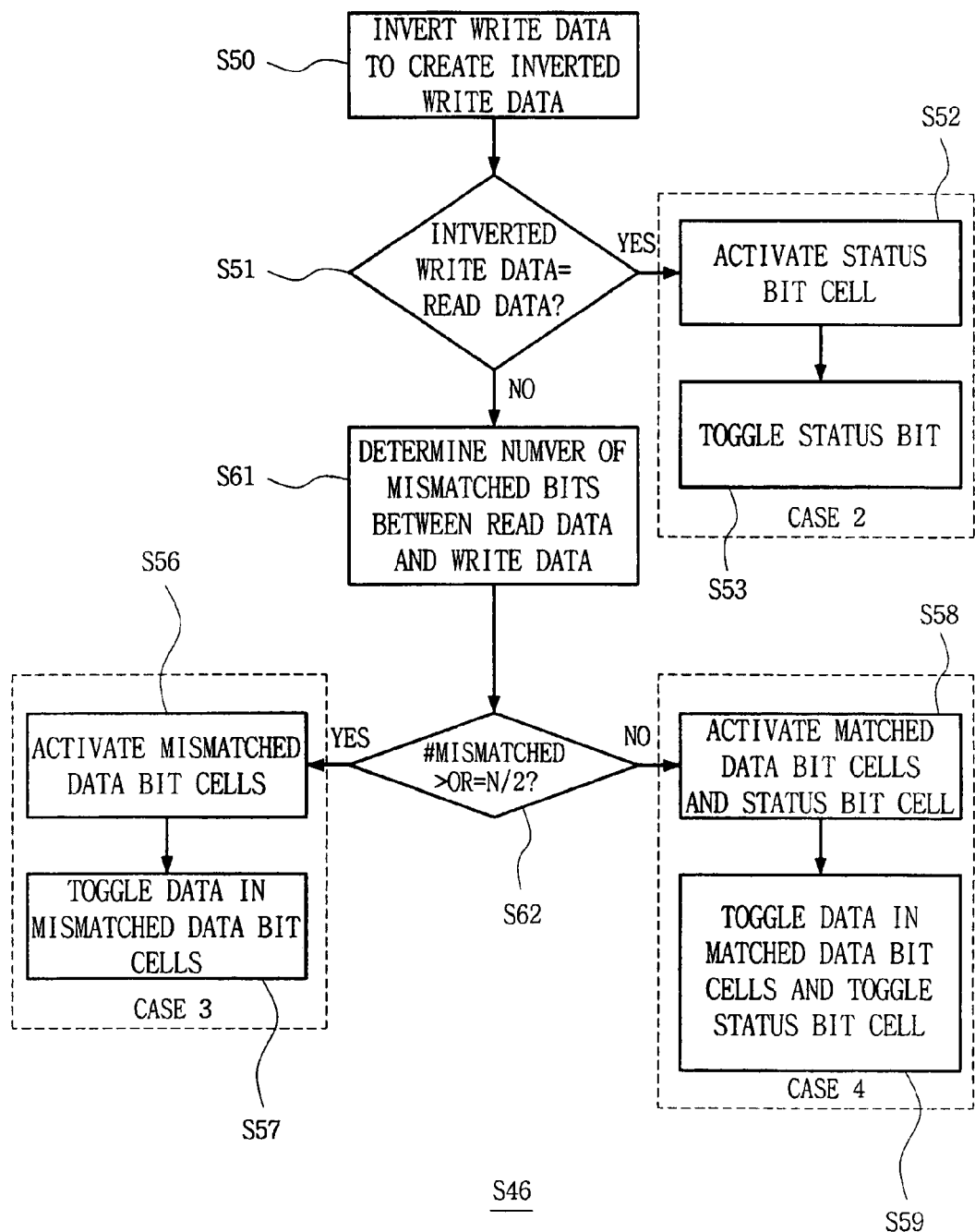
FIG. 3C is a flowchart for the selective data and/or status bit write operations shown in FIG. 3A, according to an embodiment of the invention.
Figure 3D:
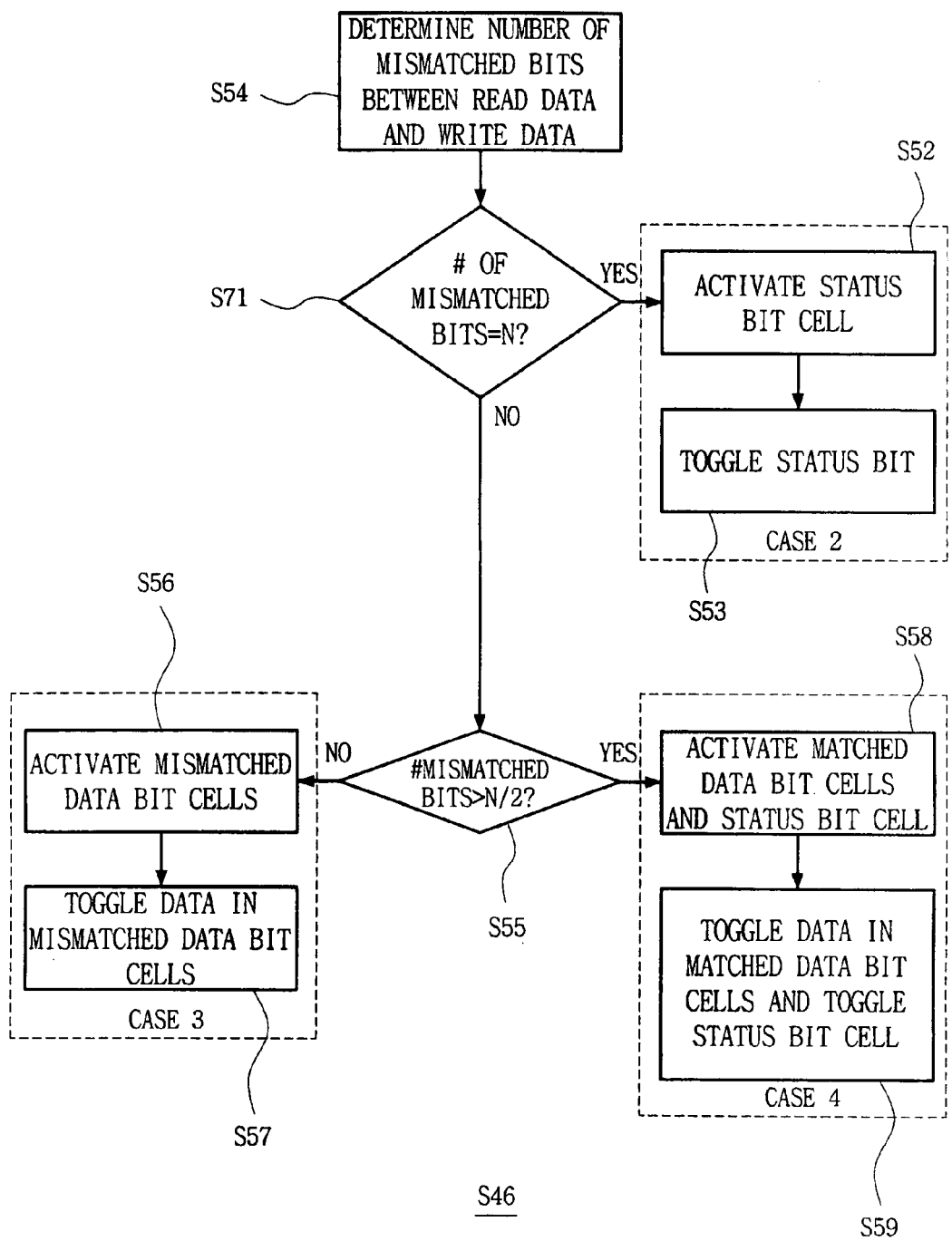
FIG. 3D is a flowchart for the selective data and/or status bit write operations shown in FIG. 3A, according to an embodiment of the invention.

At some time prior to conditional step S42, the process receives write data in step S40. The write data preferably has the same number of bits as the read data. In conditional step S42, the process determines whether the write data is equal to the read data.

Where conditional step S42 is satisfied, the process terminates in step S44 without activation of any memory cells. As used herein, such termination is referred to as case 1. The combination of pre-read cell data "0000 0000," a "high" status bit, and write data "1111 1111" results in a case 1 scenario. Because of the high status bit, the pre-read data must be inverted (in step S34) to "1111 1111", and the process determines in step S42 that the write data is equal to the read data. This example is illustrated beginning in row 410 of the table in FIG. 4.

Where conditional step S42 is NOT satisfied, the process advances to step S46 to execute selective data and/or status bit write operations. FIGS. 3B, 3C, and 3D illustrate alternative embodiments for performing step S46.

FIG. 3B is a flowchart for the selective data and/or status bit write operations (step S46) shown in FIG. 3A, according to an embodiment of the invention. In the illustrated embodiment, the process begins in step S50 by inverting the write data to create inverted write data. Then, in conditional step S51, the process determines whether the inverted write data is equal to the read data.

Where conditional step S51 is satisfied, the process advances to step S52 to activate the status bit cell, then actually toggles the status bit cell in step S53. As used herein, toggle means changing the state of a bit (e.g. from a 0 to a 1, or from a 1 to a 0). Together, steps S52 and S53 are referred to herein as case 2. Note that in case 2, no data bit cells are activated.

The combination of pre-read cell data "0000 0111," a "high" status bit, and write data "0000 0111" brings about a case 2 scenario. In this example, the high status bit is detected in conditional step S32, the pre-read cell data is inverted in step S34, and the read data output in step S36 is "1111 1000." Of course this does not match the write data in conditional step S42. But the inverted write data output from step S50 is "1111 1000," which satisfies conditional step S51. And so the status bit cell is activated and toggled in steps S52 and S53, respectively. The foregoing example is illustrated beginning in row 420 of the table in FIG. 4.

Where the result of conditional step S51 is NOT satisfied, the process advances to step S54 to determine a number of mismatched bits between the read data and the write data. This is a bit-by-bit comparison. Next, in conditional step S55, the process determines whether the number of mismatched bits is greater than N/2 (where N is the number of bits in a word).

Where conditional step S55 is NOT satisfied, the process activates mismatched data bit cells in step S56 and toggles data in the mismatched data bit cells in step S57. Together, steps S56 and S57 are referred to herein as case 3. Note that in case 3, the status bit is not toggled.

The combination of pre-read cell data "0000 1001," a "high" status bit, and write data "1111 0111" brings about a case 3 scenario. In this example, the high status bit is detected in conditional step S32, the pre-read cell data is inverted in step S34, and so the read data output in step S36 is "1111 0110." This does not quite match the write data in conditional step S42. Nor does it match inverted write data "0000 1000" in conditional step S51. In this example, there is only one mismatched bit between the read data and the write data: the least significant bit (LSB). Since this example uses an 8-bit word, N/2=8/2=4. And because 1 is not greater than 4, the condition of step S55 is NOT satisfied. Accordingly, the LSB data bit cell is activated in memory and toggled from a "1" to a "0" in steps S56 and S57, respectively. The foregoing example is illustrated beginning in row 430 of the table in FIG. 4.

Where conditional step S55 is satisfied, the process activates matched data bit cells and the status bit cell in step S58, and toggles data in the matched data bit cells and the status bit cell in step S59. Together, steps S58 and S59 are referred to herein as case 4.

The combination of pre-read cell data "0000 1000," a "high" status bit, and write data "0000 0000" brings about a case 4 scenario. In this example, the high status bit is detected in conditional step S32, the pre-read cell data is inverted in step S34, and so the read data output in step S36 is "1111 0111." Of course this does not match the write data in conditional step S42. Nor does it match inverted write data "1111 1111" in conditional step S51. In this example, there are 7 mismatched bits between the read data and the write data. Since this example uses 8-bit words, N/2=8/2=4. And because 7 is greater than 4, the condition of step S55 is satisfied. Accordingly, the single matched data bit cell and the status bit are activated and toggled in steps S58 and S59, respectively. The foregoing example is illustrated beginning in row 440 of the table in FIG. 4.

FIG. 3C is a flowchart for the selective data and/or status bit write operations (step S46) shown in FIG. 3A, according to an embodiment of the invention. The process illustrated in FIG. 3C is similar to the process illustrated in FIG. 3B, except that in FIG. 3C process steps S54 and S55 have been replaced with process steps S61 and S62, respectively, to illustrate that the decision between case 3 and case 4 can be made based on a number of matched bits instead of a number of mismatched bits, according to design choice. More specifically, the process illustrated in FIG. 3C indicates that where the result of conditional step S51 is NOT satisfied, the process determines a number of matched bits between the read data and the write data in step S61. Then, in conditional step S62, the process determines whether the number of matched bits is greater than or equal to N/2. Where the result of conditional step S62 is satisfied, the process advances to step S56. Otherwise, the process advances to step S58.

FIG. 3D is a flowchart for the selective data and/or status bit write operations (step S46) shown in FIG. 3A, according to an embodiment of the invention. The process illustrated in FIG. 3D is similar to the process illustrated in FIG. 3B, except that in FIG. 3D, step S50 is eliminated, step S54 is reordered, and step S51 is replaced with step S71. More specifically, the process in FIG. 3D begins by determining a number of mismatched bits between read data and write data in step S54. Then, in conditional step S71, the process determines whether the number of mismatched bits is equal to N. Where conditional step S71 is satisfied, the process advances to step S52. Otherwise, the process advances to conditional step S55.

The processes described above with reference to FIGS. 3B, 3C, and 3D can be used in the alternative, according to design choice. Moreover, the process described above with reference to FIGS. 3A, 3B, 3C, and 3D may be implemented in hardware, in software, or in a combination of hardware and software.

FIG. 4 is a table illustrating the number of memory cells activated in a write operation according to an embodiment of the invention. FIG. 4 includes additional examples of case 2, case 3, and case 4 data writes than what is described above with respect to rows 410, 420, 430, and 440. FIG. 4 also highlights the total number of memory cells (data bit cells and/or status bit cell) that must be activated for each illustrated example.

FIG. 5 includes three tables (510, 520, and 530), each table being associated with a different 16-bit data write example. In each of the three cases, the initial pre-read cell data is "0000 0000 0000 0000," and the initial pre-read status bit (for embodiments of the invention, a/k/a "proposed art" in FIG. 5) is assumed to be low (zero).

In table 510, the write data is "0000 0000 0011 1111." According to case 3 described herein, this data can be stored by activating 6 mismatched data bit cells (row 512). Such an approach requires activation of 10 less bits than a conventional art 1 approach, and the same amount of bits as the conventional art 2 approach.

In table 520, the write data is "0000 0011 1111 1111." According to case 4 described herein, this data can be stored by activating 6 matched cells and 1 status bit cell (7 bits total, row 522). Such an approach requires activation of 9 less bits than a conventional art 1 approach, and 3 less bits than a conventional art 2 approach.

In table 530, the write data is 111 1111 1111 111." According to case 2 described herein, this data can be stored by activating a single status bit cell (row 532). Such an approach requires activation of 15 fewer bits than either a conventional art 1 approach or a conventional art 2 approach.

Figure 6:
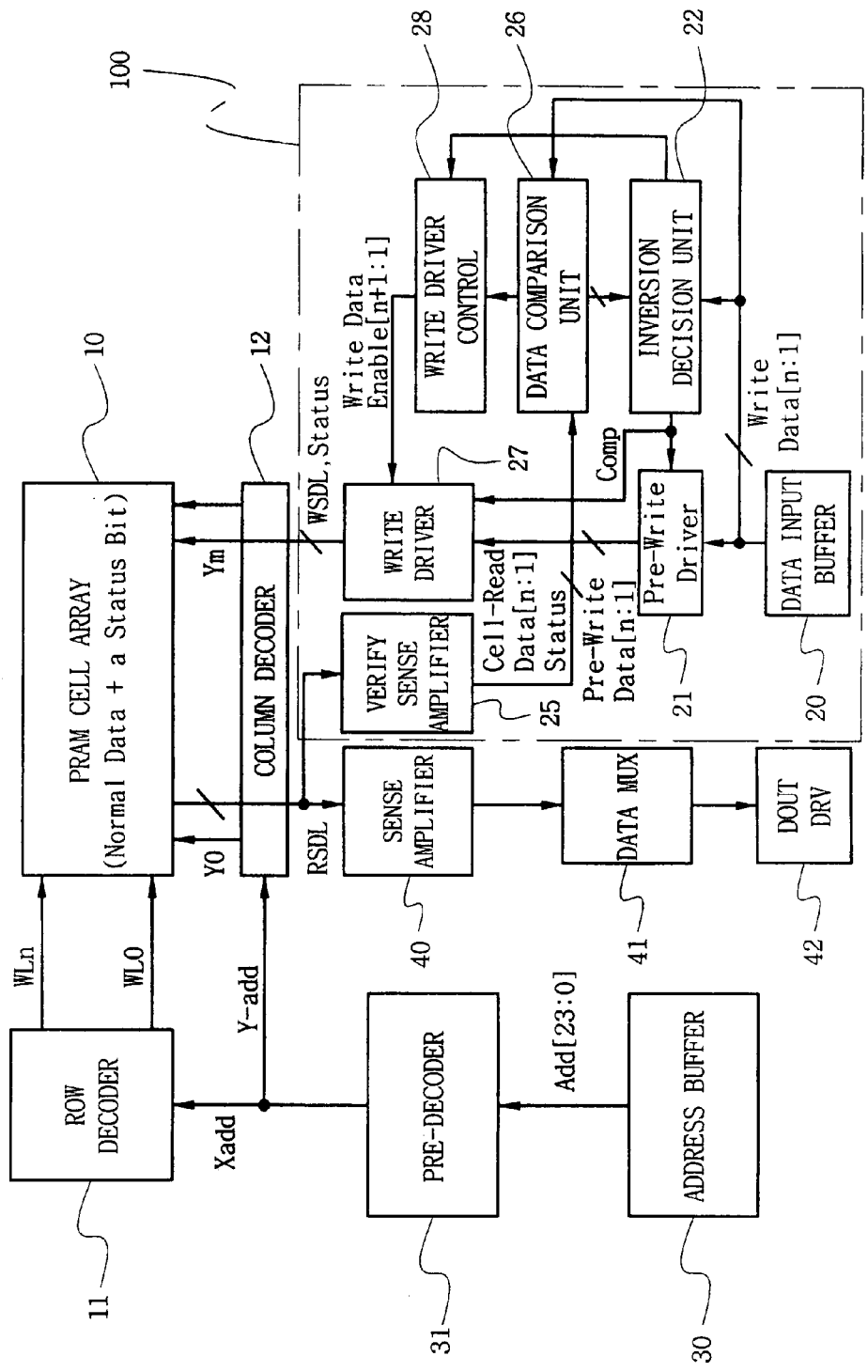
FIG. 6 is a block diagram of a semiconductor memory device according to an embodiment of the invention.

FIG. 6 is a block diagram of a semiconductor memory device according to an embodiment of the invention. The illustrated device includes a memory cell array 10, a row decoder 11, a pre-decoder 31, an address buffer 30, a column decoder 12, a sense amplifier 40, a data multiplexer (mux) 41, a data output driver 42 and a write circuit device 100.

The memory cell array 10 may include a data cell block that has a plurality of data bit cells, and a status cell block having a plurality of status bit cells. Each of the status bit cells corresponds to a predefined quantity of data bit cells. For example, one status bit cell may be associated with 16 data bit cells. A status bit cell may also be referred to as a flag memory cell.

The address buffer 30 is configured to receive a memory address associated with a read or write command. The pre-decoder 31 and the row decoder 11 are configured to decode the received memory address to row information, and the pre-decoder 31 and the column decoder 12 are configured to decode the received address to column information.

The sense amplifier 40, data mux 41, and data output driver 42 are coupled to read data out of the memory cell array 10.

The write circuit device 100 includes a verify sense amplifier 25, a data input buffer 20, a pre-write driver 21, a write driver 27, a data comparison unit 26, an inversion decision unit 22 and a write driver controller 28.

The verify sense amplifier 25 is configured to pre-read data cells and associated status bit cells in the memory cell array 10 prior to execution of a write command. The verify sense amplifier 25 may determine pre-read data based on current measurements and a comparison of the measured current to a reference current value. As an example, the verify sense amplifier may read 16 bits of pre-read data and a single associated status bit, but the invention is not limited to this format.

The data comparison unit 26 is configured to receive write data from the data input buffer 20 and pre-read data from the verify sense amplifier 25. The data comparison unit 26 is further configured to compare write data and/or inverted write data with the pre-read data. Such comparison data outputs are illustrated as "compare result [n:1]" and "Inverse compare result [n:1]" in FIGS. 7 and 8.

The inversion decision unit 22 is configured to receive comparison data from the data comparison unit 26, and further configured to output a inversion decision "Comp" signal based on the comparison data. The pre-write driver 21 is configured to receive the "Comp" signal and invert (or toggle) bits of write data input through data input buffer 20 based on the state of the "Comp" signal. The write driver controller 28 is configured to receive the comparison data from the data comparison unit 26 and output write enable signals to the write driver 27. Advantageously, the write enable signals from write driver controller 28 are designed to mask all bits that do not need to be written. For example, the write driver controller 28 may only enable 3 bits associated with "matched" or "mismatched" bits as described above with reference to cases 3 and 4. The write driver 27 is configured to write data output from the pre-write driver 21 to the memory cell array 10 in response to write enable signals from the write driver controller 28.

Thus, the write circuit 100 is configured to minimize the number of memory cells to be written based on the first and second comparison data of the data and the inversion decision.

With reference to FIGS. 3A, 3B, 3C, and 3D: the verify sense amplifier 25 may perform step S30; the data buffer 20 may perform step S40; the data comparison unit 22 and the inversion decision unit 22 may function together to perform steps S32, S34, S36, S38, S42, S51, S54, S55, S61, S62, and/or S71; and the pre-write driver 21, write driver controller 28, and write driver 27 may function together to execute steps S52, S53, S56, S57, S58, and S59.

Figure 7:
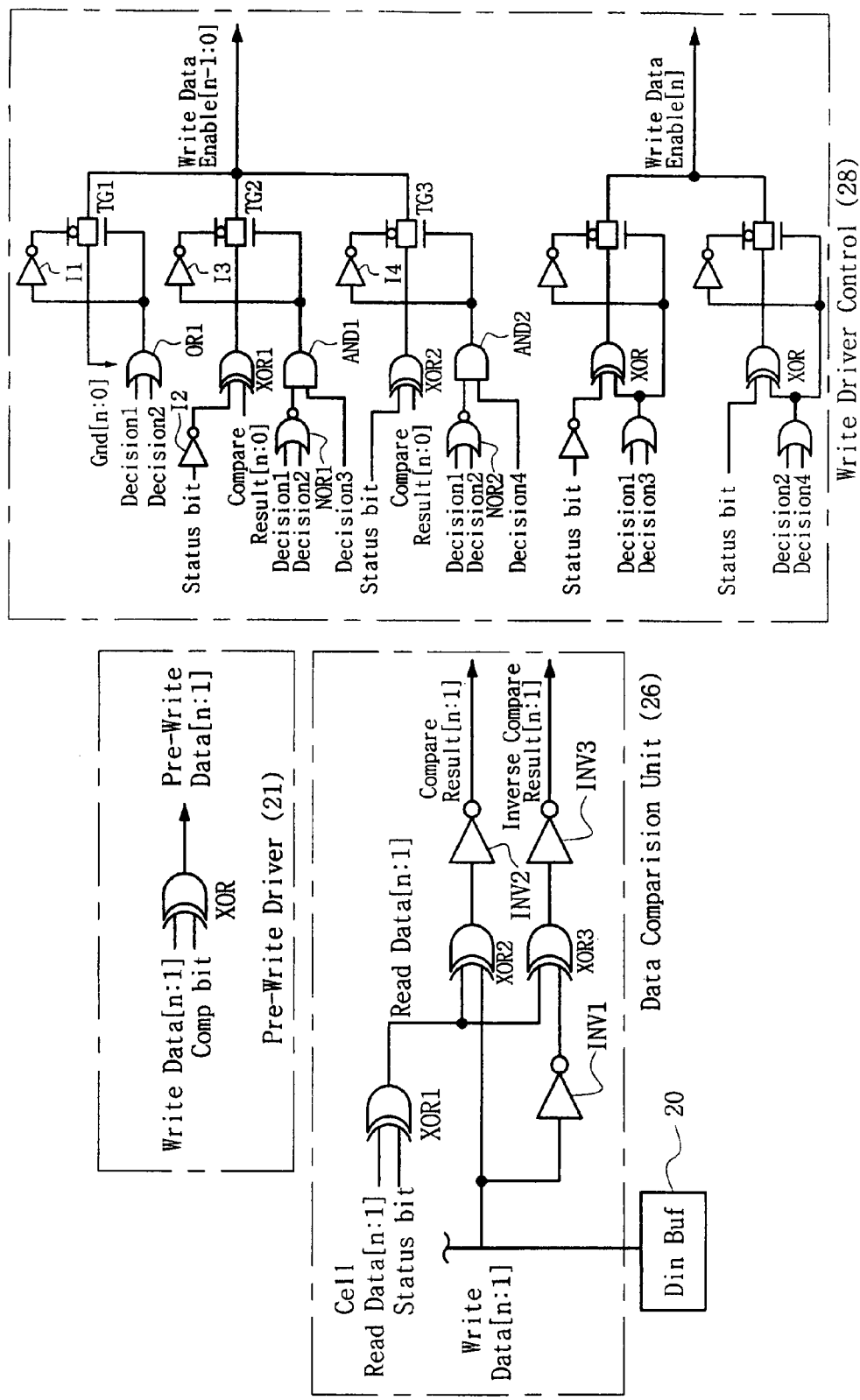
FIGS. 7 and 8 are circuit diagrams for components shown in FIG. 6 according to an embodiment of the invention.
Figure 8:
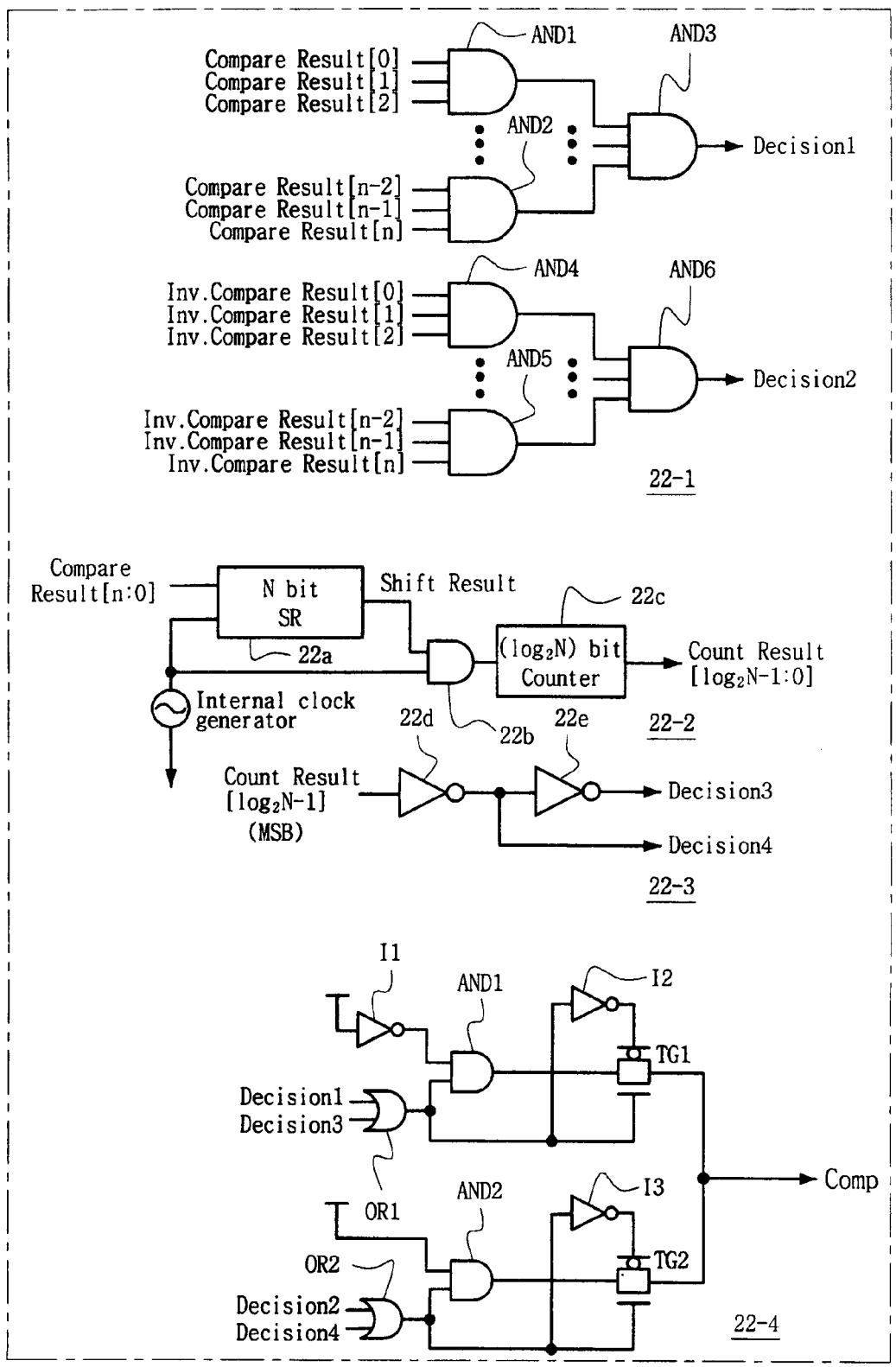

FIGS. 7 and 8 are circuit diagrams for components shown in FIG. 6 according to an embodiment of the invention.

As illustrated in FIG. 7, the pre-write driver 21 may include an exclusive OR gate (XOR). When inversion decision signal Comp is high, input write data is inverted and output. When the inversion decision signal Comp is low, input write data is output without inversion.

As further illustrated in FIG. 7, the data comparison unit 26 may include exclusive OR gates XOR1, XOR2 and XOR3, and inverters INV1, INV2 and INV3. Cell Read Data [n:1] from the verify read circuit 25 is inverted or non-inverted by the exclusive OR gate XOR1 based on the logic level of the status bit. Read data appearing on an output of the exclusive OR gate XOR1 is compared with corresponding bits of write data or inverted write data in exclusive OR gates XOR2 and XOR3, respectively. First and second comparison result data (Compare Result [n:1] and Inverse Compare Result [n:1]) are output through inverters INV2 and INV3, respectively.

As further illustrated in FIG. 7, the write driver controller 28 includes inverters 11-14, OR and NOR gates, exclusive OR gates, and transmission gates TG1-TG3. The write driver controller 28 is configured to mask bits that need not be written to the memory cell array 10. Signals of Decision 1 through Decision 4 are signals output from the inversion decision unit 22.

FIG. 8 illustrates an embodiment of the inversion decision unit 22. In FIG. 8, a circuit block 22-1 includes multiple AND gates to produce Decision 1 and Decision 2 outputs. When all inputs match, the signal of Decision 1 is activated; when all inputs do not match, the signal of Decision 2 is activated. Decision 1 and 2 signals relate to case 1 and 2, respectively.

As further illustrated in FIG. 8, a circuit block 22-3 is includes a shift register 22a, an AND gate 22d, a counter 22c and inverters 22d and 22e. The inverters 22d and 22e output Decision 3 and Decision 4 signals, respectively. The counter 22c may be a 5 bit counter using an internal clock. The counter 22c is configured to count a number of matched bits. When the number of matched bits is greater than N/2, circuit block 22-c is configured to output a Decision 3 signal. When the number of matched bits is less than N/2, the circuit block 22-c is configured to output a Decision 4 signal. Decision 3 and 4 signals relate to case 3 and 4, respectively.

As further illustrated in FIG. 8, a circuit block 22-4 includes various logic gates and transmission gates TG1 and TG2, and is configured to generate the inversion decision signal Comp.

As described above, the disclosed circuits and methods can decrease the number of cells that must be activated during a write operation. One potential benefit of this is that write current can be substantially reduced. Higher speed write operations may also be possible.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, status bits of flag cell may be stored with opposed logics and so a comparison operation may be performed oppositely thereto, or internal elements of the circuit may be replaced with other equivalent elements. Moreover, the invention can be adapted to various data word sizes such as 4-bit, 8-bit, 16-bit or 32-bit words. The invention may also be applicable to, and advantageous for, memory devices other than variable resistive semiconductor memory devices. Accordingly, these and other changes and modifications are seen to be within the true spirit and scope of the invention as defined by the appended claims.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method for writing data to a memory device comprising:
    receiving N-bit write data;
    reading N-bit cell data in the memory device;
    reading a status bit in the memory device, the status bit being associated with the N-bit cell data;
    if the status bit is high, inverting each bit of the N-bit cell data to produce inverted N-bit cell data and comparing each bit of the inverted N-bit cell data with a corresponding bit of the N-bit write data to produce a first comparison data, and
    if the status bit is low, comparing each bit of the N-bit cell data with a corresponding bit of the N-bit write data to produce the first comparison data.

2. The method of claim 1, further comprising, if the first comparison data indicates that all N bits have matching logic values, terminating the writing.

3. The method of claim 1, further comprising:
    inverting the N-bit write data to produce inverted N-bit write data;
    If the status bit is high, comparing each bit of the inverted N-bit cell data with a corresponding bit of the inverted N-bit write data to produce a second comparison data; and
    If the status bit is low, comparing each bit of the N-bit cell data with a corresponding bit of the inverted N-bit write data to produce the second comparison data.

4. The method of claim 3, further comprising, if the second comparison data indicates that all N bits have matching logic values:
    activating the status bit in the memory device; and
    toggling the status bit in the memory device.

5. The method of claim 1, further comprising:
    determining a number of mismatched data bits associated with the first comparison data; and
    determining whether the number of mismatched data bits is greater than N/2.

6. The method of claim 5, further comprising, if the number of mismatched data bits is not greater than N/2:
    activating data bit cells in the memory device associated with mismatched data bits; and
    toggling the activated data bit cells.

7. The method of claim 5, further comprising, if the number of mismatched data bits is greater than N/2:
    activating data bit cells in the memory device associated with matched data bits;
    activating the status bit in the memory device;
    toggling the activated data bit cells; and
    toggling the status bit.

8. The method of claim 1, further comprising:
    determining a number of matched data bits associated with the first comparison data; and
    determining whether the number of matched data bits is greater than or equal to N/2.

9. The method of claim 8, further comprising, if the number of matched data bits is greater than or equal to N/2:
    activating data bit cells in the memory device associated with mismatched data bits; and
    toggling the activated data bit cells in the memory device.

10. The method of claim 8, further comprising, if the number of matched data bits is not greater than or equal to N/2:
    activating data bit cells in the memory device associated with matched data bits;
    activating the status bit in the memory device;
    toggling the activated data bit cells in the memory device; and
    toggling the status bit in the memory device.

11. The method of claim 1, further comprising:
    determining a number of mismatched data bits associated with the first comparison data; and
    determining whether the number of mismatched data bits is equal to N.

12. The method of claim 11, further comprising, if the number of mismatched data bit is equal to N:

activating the status bit in the memory device; and toggling the status bit in the memory device.

13. A write circuit comprising:

a verify sense amplifier configured to read N-bit read data in a memory device and further configured to read a status bit in the memory device; and a data comparison unit coupled to the verify sense amplifier, the data comparison unit configured to optionally invert the N-bit read data based on the status bit, make a first comparison between the optionally inverted N-bit read data and N-bit write data, and make a second comparison between the selectively inverted N-bit read data and inverted N-bit write data.

14. The write circuit of claim 13, further comprising an inversion decision unit coupled to the data comparison unit, the inversion decision unit configured to determine whether to toggle the status bit in the memory device as part of a write operation.

15. The write circuit of claim 14, wherein the inversion decision unit is further configured to determine whether to toggle each of the N-bit write data bits as part of the write operation.

16. The write circuit of claim 15, further comprising a pre-write driver, the pre-write driver coupled to the inversion decision unit and configured to toggle determined ones of the N-bit write data bits as part of the write operation.

17. The write circuit of claim 16, further comprising a write control driver coupled to the data comparison unit, the write control driver configured to output write enable signals, the write enable signals masking at least one write bits based at least in part on one of the first comparison and the second comparison.

18. The write circuit of claim 17, further comprising a write driver coupled to the pre-write driver and the write control driver, the write driver configured to toggle N-bit data and the status bit based at least in part on the write enable signals.

* * * * *